(12) United States Patent
Anderl (10) Patent No.: US 10,842,049 B2
(45) Date of Patent: Nov. 17, 2020

(54) COOLING SYSTEM FOR AN ELECTRONICS ENCLOSURE

(71) Applicant: International Business Machines Corporation, Armonk, NY (US)

(72) Inventor: William J. Anderl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 601 days.

(21) Appl. No.: 15/493,330

(22) Filed: Apr. 21, 2017

(65) Prior Publication Data
US 2018/0310437 A1    Oct. 25, 2018

(51) Int. Cl.
*H05K 7/20* (2006.01)

(52) U.S. Cl.
CPC .......... *H05K 7/207* (2013.01); *H05K 7/2019* (2013.01); *H05K 7/20172* (2013.01)

(58) Field of Classification Search
CPC ... H05K 7/207; H05K 7/20172; H05K 7/2019
USPC ......................................................... 454/184
See application file for complete search history.

(56) References Cited

U.S. PATENT DOCUMENTS

| | | | |
|---|---|---|---|
| 7,205,740 B1 | 4/2007 | Wei et al. | |
| 7,312,989 B2 | 12/2007 | Chen | |
| 7,408,774 B1 * | 8/2008 | Anderl | H05K 7/20727 174/16.1 |
| 7,542,272 B2 * | 6/2009 | Pike | G06F 1/20 165/80.3 |
| 7,701,713 B2 | 4/2010 | Li | |
| 8,462,501 B2 * | 6/2013 | Silvennoinen | H05K 7/20172 361/694 |
| 8,879,252 B2 | 11/2014 | Kelaher et al. | |
| 9,004,876 B2 | 4/2015 | Ma et al. | |
| 9,167,727 B2 | 10/2015 | Mao | |

(Continued)

FOREIGN PATENT DOCUMENTS

| | | |
|---|---|---|
| CN | 102374182 A | 3/2012 |
| JP | 08338676 A | 12/1996 |

OTHER PUBLICATIONS

IBM, "Effective Redundant Cooling Fan Swivel Mechanism for Multiple Processor System" IP.com No. IPCOM000013684D, Jun. 18, 2003.

*Primary Examiner* — Edelmira Bosques
*Assistant Examiner* — Dana K Tighe
(74) *Attorney, Agent, or Firm* — Patterson + Sheridan, LLP (57) ABSTRACT

Method and system for providing cooling to an electronics enclosure that includes redundant cooling in the event of a failure of a cooling fan. The system includes an enclosure configured to support electrical components and a fan chassis. The system also includes a plurality of cooling fans coupled to the fan chassis. Each of the plurality of cooling fans is rotatable relative to the fan chassis between a first orientation in which the fans are operable to direct air into the enclosure and a second orientation. Spacing between adjacent cooling fans is less when the second cooling fan is in the second orientation than when the second cooling fan is in the first orientation. A third one of the plurality of cooling fans automatically rotates from the second orientation to the first orientation upon the second cooling fan moving to the second orientation.

19 Claims, 7 Drawing Sheets

(56) References Cited

U.S. PATENT DOCUMENTS

2007/0047200 A1\* 3/2007 Huang ................. G06F 1/20
                                                    361/695
2012/0133255 A1\* 5/2012 Izuno ................ H05K 7/20727
                                                    312/236

\* cited by examiner

FIG. 6

COOLING SYSTEM FOR AN ELECTRONICS ENCLOSURE

BACKGROUND

The present invention relates to electronics cooling, and more specifically, to engaging a redundant cooling fan in a manner that electronics receiving uniform cooling before and after a primary cooling fan has failed.

Some electronics, such as computer servers, use one or more rows of cooling fans to cool the electrical components within an enclosure. Together, the cooling fans direct sufficient airflow into the enclosure to cool the entirety of the electrical components. Although some intermixing of air from different ones of the cooling fans occurs, the different electrical components primarily receive cooling airflow from the respective cooling fans with which the electrical components are aligned. In the event a cooling fan fails or operates below specifications, then the total amount of airflow into the enclosure may decrease. To compensate for such a decrease in total air flow, the speed with which the remaining cooling fans operate may be increased. However, such an increase in speed results in increased power consumption and increased noise. Additionally, if a cooling fan fails, the electrical components aligned with that failed cooling fan may receive insufficient cooling airflow, regardless of the fan speed.

SUMMARY

According to one embodiment of the present invention, a system comprises an enclosure configured to support electrical components disposed therein. The system also comprises a fan chassis and a plurality of cooling fans coupled to the fan chassis. Each of the plurality of cooling fans is rotatable relative to the fan chassis between a first orientation in which the fans are operable to direct air into the enclosure and a second orientation. Spacing between centers of a first cooling fan of the plurality of cooling fans and a second cooling fan of the plurality of cooling fans is less when the second cooling fan is in the second orientation than when the second cooling fan is in the first orientation. A third cooling fan of the plurality of cooling fans rotates from the second orientation to the first orientation upon the second cooling fan moving to the second orientation.

According to one embodiment of the present invention, a method comprises operating a first cooling fan and a second cooling fan of a plurality of cooling fans coupled to a fan chassis. Each of the plurality of cooling fans is rotatable relative to the fan chassis between a first orientation in which the fans are operable to direct air into an enclosure supporting electrical components and a second orientation. Spacing between centers of a first cooling fan of the cooling fans and a second cooling fan of the cooling fans is less when the second cooling fan is in the second orientation than when the second cooling fan is in the first orientation. The method also comprises detecting failure of the second cooling fan. Upon detecting the failure of the second cooling fan, the method comprises: rotating the second cooling fan from the first orientation to the second orientation; at least one of translating the second cooling fan toward the first cooling fan or translating the first cooling fan toward the second cooling fan; rotating a third cooling fan of the plurality of cooling fans from the second orientation to the first orientation; and operating the third cooling fan to direct air into the enclosure.

According to one embodiment of the present invention, a computer program product for implementing fan cooling of an electronics enclosure is provided. The computer program product comprises a computer-readable medium program having program instructions therewith. The program instructions are executable by a processor to perform an operation comprising operating a first cooling fan and a second cooling fan of a plurality of cooling fans coupled to a fan chassis. Each of the plurality of cooling fans is rotatable relative to the fan chassis between a first orientation in which the fans are operable to direct air into an enclosure supporting electrical components and a second orientation. Spacing between centers of the first cooling fan and the second cooling fan is less when the second cooling fan is in the second orientation than when the second cooling fan is in the first orientation. The program instructions are further executable by the processor to perform an operation comprising detecting failure of the second cooling fan. Upon detecting the failure of the second cooling fan, the program instructions are further executable by the processor to perform an operation comprising: rotating the second cooling fan from the first orientation to the second orientation; at least one of translating the second cooling fan toward the first cooling fan or translating the first cooling fan toward the second cooling fan; rotating a third cooling fan of the plurality of cooling fans from the second orientation to the first orientation; and operating the third cooling fan to direct air into the enclosure.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In embodiments described herein, an electronics enclosure is cooled by a row of cooling fans. Individual ones of the cooling fans are moveable (e.g., rotatable) between a first orientation and a second orientation. In the first orientation, the cooling fans direct cooling air into the electronics enclosure. In the second orientation, the cooling fans have a reduced dimension along the direction of the row such that remaining operating cooling fans on one or both sides of a failed cooling fan can move to cover most of the area previously covered by the failed cooling fan. Additionally, the row of cooling fans includes a backup cooling fan. Upon one of the cooling fans failing and moving (e.g., rotating) to the second position, room is made along the row for the backup cooling fan to move (e.g., rotate) from the second orientation to the first orientation and begin operating to direct airflow into the electronics enclosure. As a result, the electronics enclosure receives the same total amount of airflow without increasing fan speeds and any areas of the electronics enclosure not directly aligned with a cooling fan are reduced.

Figure 1:
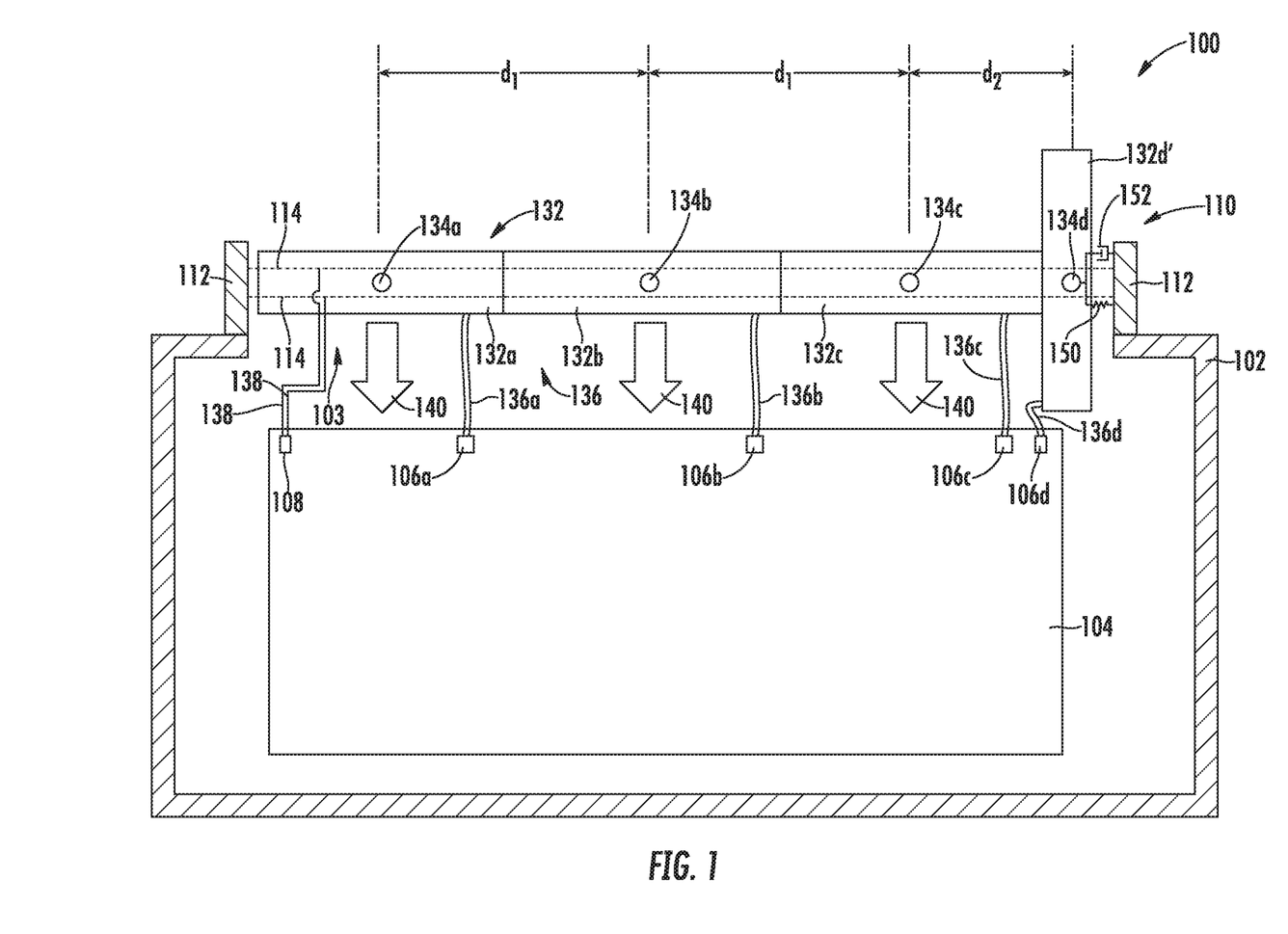
FIG. 1 is a top cross-sectional view of an electronics enclosure with three operating cooling fans in a first orientation and a fourth cooling fan in a second orientation.

FIG. 1 is a top cross-sectional view of a system 100 that includes an enclosure 102 configured to support electrical components 104 disposed therein. The electrical components 104 may include a printed circuit board (e.g., a computer motherboard), the various computer chips (e.g., central processing units), and/or various other electrical components connected to the printed circuit board (e.g., graphics cards, memory chips, and networking cards), for example. The enclosure 102 includes an opening 103. A fan chassis 110 is disposed relative to the opening 103 of the enclosure 102. In the exemplary embodiment depicted in FIG. 1, the fan chassis 110 includes supports 112 disposed on sides of the opening 103 in the chassis 102. The fan chassis 110 also includes rails 114 extending between the supports 112.

The fan chassis 110 includes a plurality of cooling fans 132 that direct air through the opening 103 into the enclosure 102 (as indicated by arrows 140). In the exemplary embodiment shown in FIG. 1, the plurality of cooling fans 132 includes a first cooling fan 132a, a second cooling fan 132b, a third cooling fan 132c, and a fourth cooling fan 132d (the plurality of cooling fans 132, collectively). The plurality of cooling fans 132 are mounted to the rails 114 via slide carriers (not shown in FIG. 1) such that the respective ones of the plurality of cooling fans 132 can translate along the rails 114. Additionally, the plurality of cooling fans 132 are rotatably coupled to the respective slide carriers via pivots 134, which enable the plurality of cooling fans 132 to rotate between a first orientation and a second orientation. In one embodiment, the pivots 134 are located at respective centers of the cooling fans 132. As illustrated in FIG. 1, the first cooling fan 132a, the second cooling fan 132b, and the third cooling fan 132c are in the first orientation in which outlets of the first cooling fan 132a, the second cooling fan 132b, and the third cooling fan 132c face the enclosure 102 such that the first cooling fan 132a, the second cooling fan 132b, and the third cooling fan 132c can direct airflow 140 into the enclosure 102. The fourth cooling fan 132d is in the second orientation (as indicated by reference number 132d'). In the second orientation, an outlet of the fourth cooling fan 132d is not facing the enclosure 102 such that the fourth cooling fan 132d cannot direct airflow into the enclosure 102. As shown in FIG. 1, the spacing $d_1$ between the pivot 134a of first cooling fan 132a and the pivot 134b of the second cooling fan 132b and the spacing $d_1$ between the pivot 134b of second cooling fan 132b and the center 134c of third cooling fan 132c is greater than the spacing $d_2$ between the pivot 134c of the third cooling fan 132c and the pivot 134d of the fourth cooling fan 132d'.

In the embodiment shown in FIG. 1, the plurality of cooling fans 132 receives power from the electrical components 104 in the enclosure 102. For example, the first cooling fan 132a is coupled to a power/data socket 106a of the electrical components 104 via a power cable 136a. The second cooling fan 132b is coupled to a power/data socket 106b of the electrical components 104 via a power cable 136b. The third cooling fan 132c is coupled to a power/data socket 106c of the electrical components 104 via a power cable 136c. The fourth cooling fan 132d is coupled to a power/data socket 106d of the electrical components 104 via a power cable 136d. In at least one embodiment, the electrical components 104 control power delivery to the power sockets 106. For example, in at least one embodiment, the electrical components 104 comprise a computer motherboard executing a Basic Input/Output System (BIOS), and the BIOS can track operating parameters of the cooling fans 132, such as rotation speed and power consumption. The BIOS may receive data from the cooling fans 132 indicating whether the respective cooling fans 132 are in the first orientation or the second orientation. The BIOS can also selectively provide power to the different cooling fans 132, based on which cooling fans 132 are in the first orientation. As discussed above, the first cooling fan 132a, the second cooling fan 132b, and the third cooling fan 132c are in the first orientation. Therefore, the BIOS can transmit power to the power/data sockets 106 for the first cooling fan 132a, the second cooling fan 132b, and the third cooling fin. Also, as discussed above, the fourth cooling fan 132d is in the second orientation. Therefore, the BIOS can withhold power from the power/data socket 106d for the fourth cooling fan 132d. In at least one embodiment, the power/data sockets 106 also provide power to actuate electrical mechanisms (e.g., solenoids) that move the respective cooling fans 132 between the first orientation and the second orientation. Alternatively or in addition, the respective cooling fans 132 and/or slide carriers could communicate whether they are in the first orientation or the second orientation to the electrical components 104 (e.g., to the above-discussed BIOS) via the power/data socket 108 or the respective power-data sockets 106.

Figure 2:
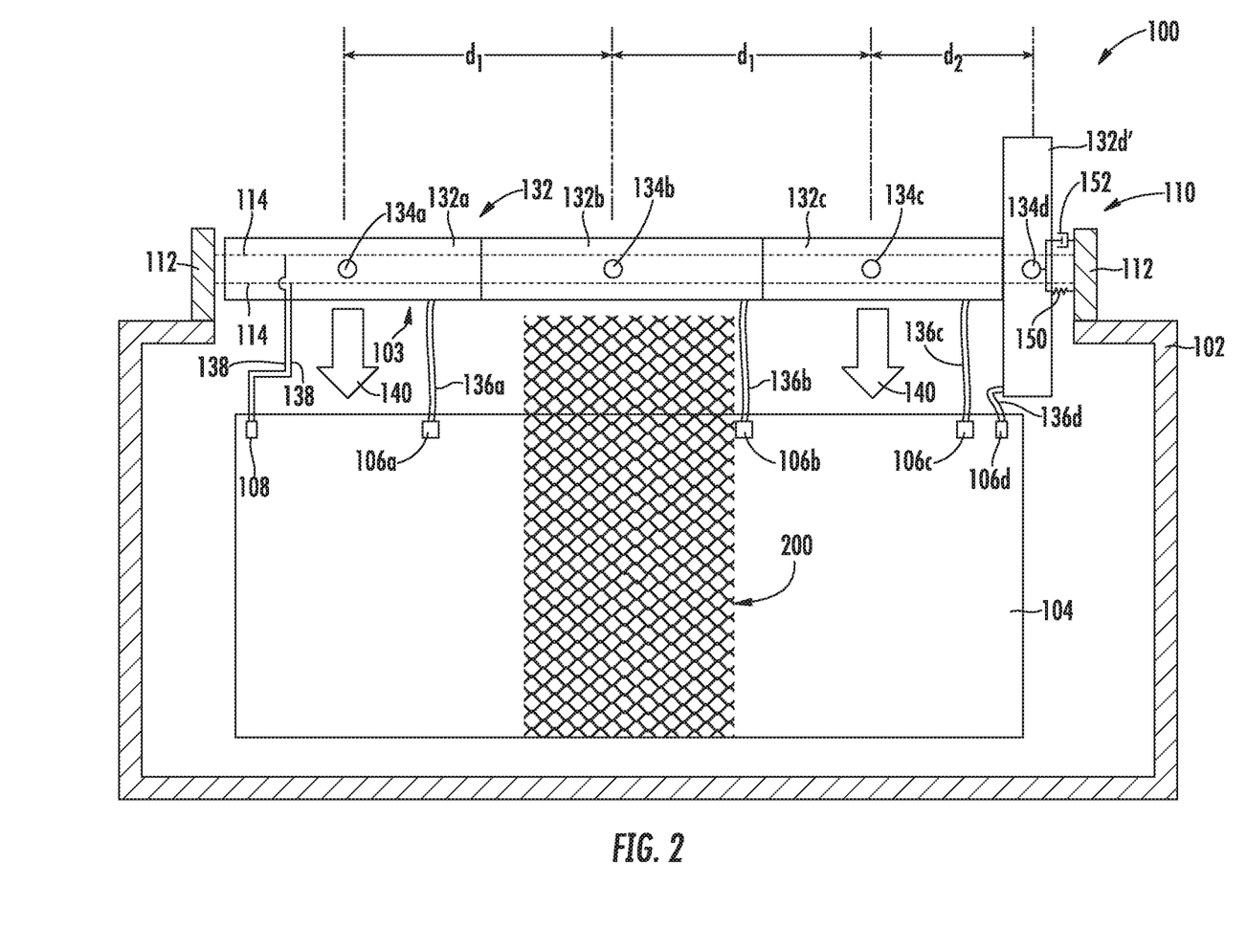
FIG. 2 is a top cross-sectional view of the electronics enclosure of FIG. 1, wherein one of the three operating cooling fans has failed.
Figure 3:
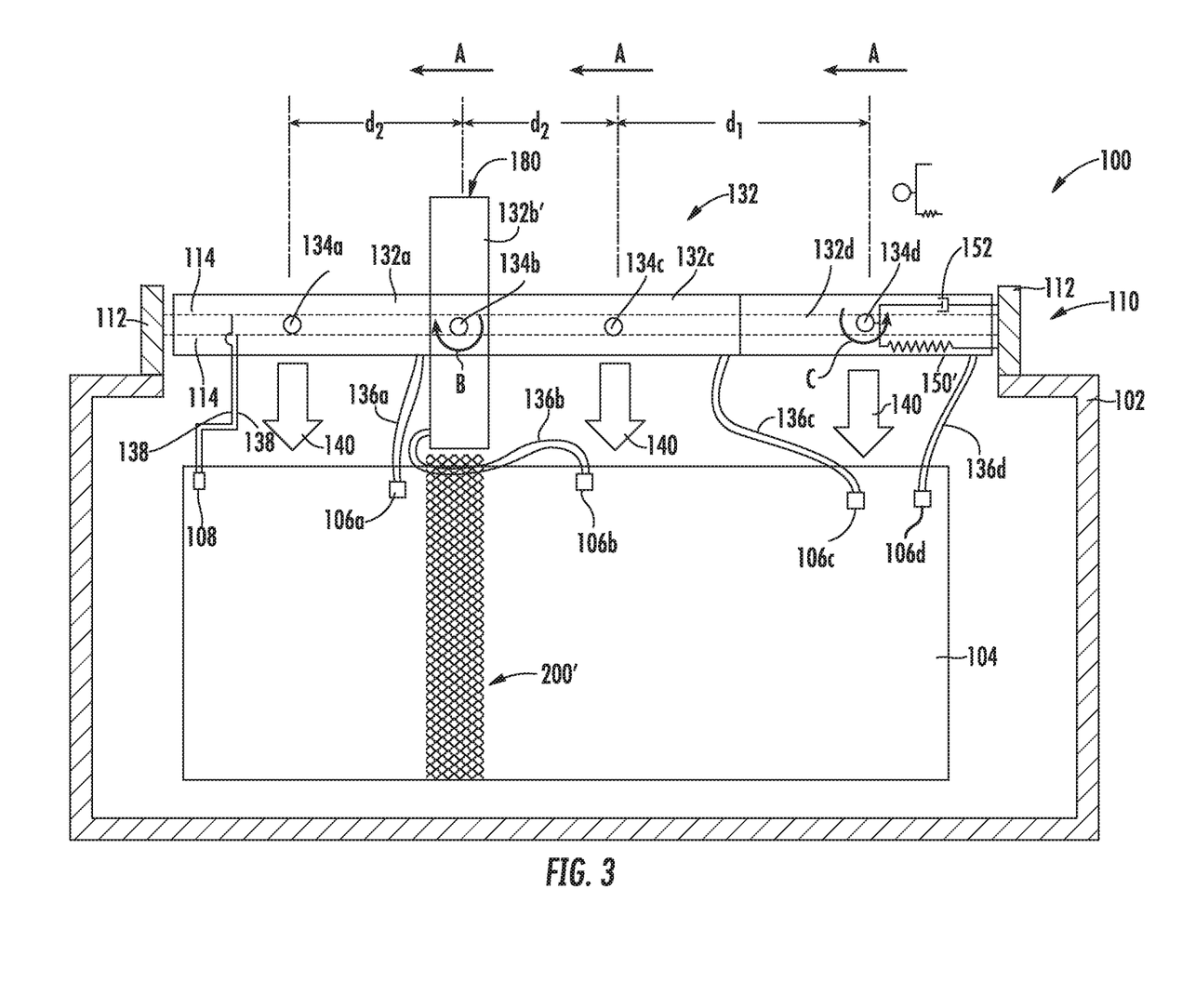
FIG. 3 is a top cross-sectional view of the electronics enclosure of FIG. 1, wherein the failed cooling fan has rotated from the first orientation to the second orientation, and wherein the fourth cooling fan has rotated from the second orientation to the first orientation and is operating.

FIGS. 1-3 also illustrate an additional power/data socket 108 connected to the rails 114 of the fan chassis 110 via power cables 138 (or electrodes). As will be discussed in greater detail below, certain aspects of the cooling fans 132 and/or slide carriers on which the cooling fans 132 are mounted may selectively use electrical power, supplied by the power socket 108 to the rails 114, to power the cooling fans 132. Additionally, in certain embodiments, the powered rails 114 may be used to actuate electrical mechanisms (e.g., solenoids) that move the respective cooling fans 132 between the first orientation and the second orientation. Alternatively or in addition, the respective cooling fans 132 and/or slide carriers could communicate whether they are in the first orientation or the second orientation to the electrical components 104 (e.g., to the above-discussed BIOS) via the power/data socket 108.

FIG. 2 illustrates the system of FIG. 1, wherein the second cooling fan 132b has failed. The term "failure," as used herein, refers to a cooling fan stopping (e.g., seizing) or operating outside of design parameters. For example, a cooling fan 132 may "fail" if a bearing facilitating rotation of the cooling fan 132 seizes. As another example, a cooling fan 132 may "fail" if the grease lubricating the bearing degrades or otherwise breaks down. Such a breakdown of the grease may cause increased friction in the bearing, which may slow the rotation speed of the cooling fan 132 and/or increase the amount of power required to operate the cooling fan 132. As shown in FIG. 2, the failure of the second cooling fan 132 results in a region 200 aligned with the second cooling fan 132b that does not receive the intended amount of cooling air. While some airflow from the first cooling fan 132a and some airflow from the third cooling fan 132c may spread to the region 200, electrical components 104 in the region 200 may not get the intended amount of cooling.

FIG. 3 illustrates the system 100 after the plurality of cooling fans 132 have adapted to the failure of the second cooling fan 132b. As shown in FIG. 3, the second cooling fan 132b' has rotated from the first orientation to the second orientation in the direction of arrow B in response to the failure of the cooling fan 132b'. As a result, the spacing from the center of the second cooling fan 132b' to the center of the first cooling fan 132a has been reduced from $d_1$ to $d_2$. Additionally, the second cooling fan 132b and the third cooling fan 132c have translated in the direction of arrows A such that the second cooling fan 132b' is adjacent to the first cooling fan 132a and such that the third cooling fan 132c is adjacent to the second cooling fan 132b'. Furthermore, the fourth cooling fan 132d has rotated from the second orientation to the first orientation and has translated in the direction of arrows A such that the fourth cooling fan 132d is adjacent to the third cooling fan 132c. The fan chassis 110 may include an elastic member 150 that applies a biasing force to urge the plurality of cooling fans 132 in the direction of arrows A. As shown in FIGS. 1-3, the elastic member 150 may be a spring. As shown in FIGS. 1-3, the elastic member 150 is loaded in compression in FIGS. 1 and 2 such that when the second cooling fan 132b' is rotated to the second orientation shown in FIG. 3, the elastic member 150 exerts a biasing force that urges the fourth cooling fan 132d toward the third cooling fan 132c. In turn, the third cooling fan 132c pushes the second cooling fan 132b toward the first cooling fan 132a. In various other embodiments, the elastic member 150 could be in tension. For example, the elastic member 150 could be a spring or bungee cord connected to the support 112 closest to the first cooling fan 132a and also connected to the fourth cooling fan 132d', wherein the elastic member 150 is stretched in tension.

In the illustrated embodiment, the fourth cooling fan 132d is also connected to a damper 152. The damper 152 exerts a force in a direction opposite arrows A and proportional to the speed with which the fourth cooling fan 132d translates in the direction of arrow A. The damper 152 acts to slow the speed with which the fourth cooling fan 132d moves in the direction of arrows A. As a result, the fourth cooling fan 132d can fully move from the second orientation to the first orientation before the fourth cooling fan 132d contacts the third cooling fan 132c. In various other embodiments, the fourth cooling fan 132d could be restrained from moving in the direction of arrows A by a latch. The latch could be released by the fourth cooling fan 132d as the fourth cooling fan 132d moves from the second orientation to the first orientation.

After the second cooling fan 132b' is rotated to the second orientation and the fourth cooling fan 132 is rotated to the first orientation as shown in FIG. 3, power may be directed to the fourth cooling fan 132d. For example, a BIOS or other operating system being executed by the electrical components 104 may direct power to the power socket 106d such that the fourth cooling fan 132d receives power via the power cable 136d. At the same time, the BIOS may turn off the power socket 106b such that the second cooling fan 132b shuts down. As a result of the second cooling fan 132b rotating to the second orientation, the region 200' (shown in FIG. 3) not receiving direct airflow from one of the plurality of cooling fans 132 is significantly reduced.

The above-described failure of the second cooling fan 132b and process of rotating the second cooling fan 132b to the second orientation and rotating the fourth cooling fin 132 D to the first orientation is applicable if different ones of the plurality of cooling fans 132 fail. For example, if the first cooling fan 132a failed, then the first cooling fan 132a would rotate from the first orientation to the second orientation. Additionally, the second cooling fan 132b and the third cooling fan 132c would translate along the rails 114 in the direction of arrows A toward the first cooling fan 132a. Furthermore, the fourth cooling fan 132d would rotate from the second orientation to the first orientation and would translate along the rails 114 in the direction of arrows A toward the third cooling fan 132c. As another example, if the third cooling fan 132c failed, then the third cooling fan 132c would rotate from the first orientation of the second orientation and translate along the rails 114 toward the second cooling fan 132b. Additionally, the fourth cooling fan 132d would rotate from the second orientation to the first orientation and would also translate along the rails 114 in the direction of arrows A toward the third cooling fan 132c. The above-described processes for rotating and moving fans to replace a failed fan would be applicable to a fan chassis having fewer or more than the illustrated four fans in the plurality of fans 132.

In at least one embodiment, the respective ones of the plurality of cooling fans 132 include visual identifiers along edges that are visible outside of the enclosure when any one of the plurality of cooling fans 132 rotate to the second orientation. FIG. 3 illustrates an edge 180 of the second cooling fan 132b' that is visible outside of the enclosure 102 after the second cooling fan 132b' has rotated to the second orientation. In one embodiment, the edge 180 includes a light emitting diode (LED), organic light emitting display (OLED), or other illumination that is visible outside of the enclosure 102. In another embodiment, the edge 180 includes a color indicator (e.g., fluorescent yellow) and/or pattern (e.g., fluorescent yellow and black stripes) likely to draw the attention of a technician or other person to indicate that the fan has rotated to the second orientation.

Figure 4A:
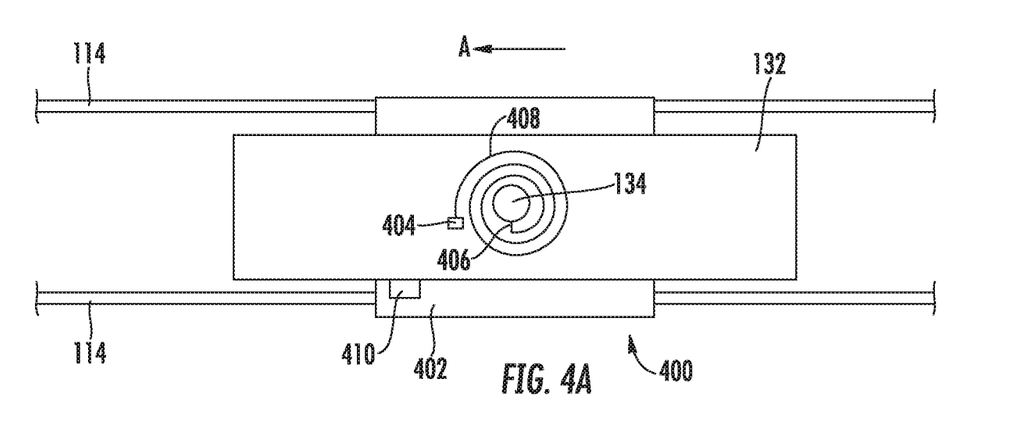
FIG. 4A is a top view of a cooling fan pivotably coupled to a slide carrier with an actuator, according to one embodiment, wherein the cooling fan is in the first orientation.
Figure 4B:
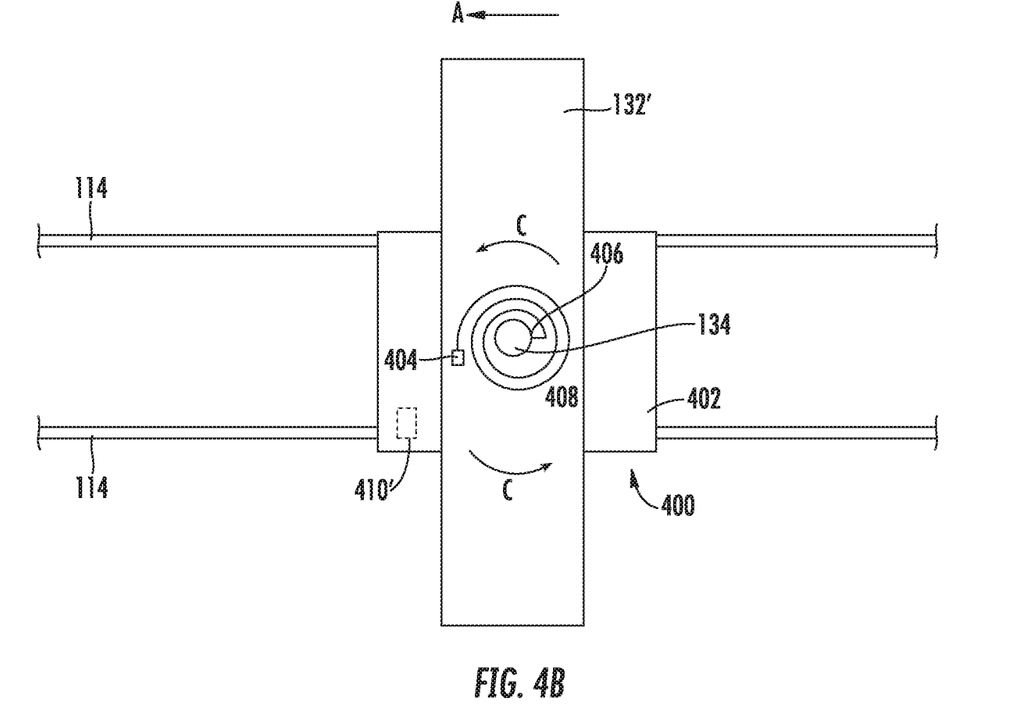
FIG. 4B is a top view of the cooling fan of FIG. 4A, where the cooling fan is in the second orientation.
Figure 4C:
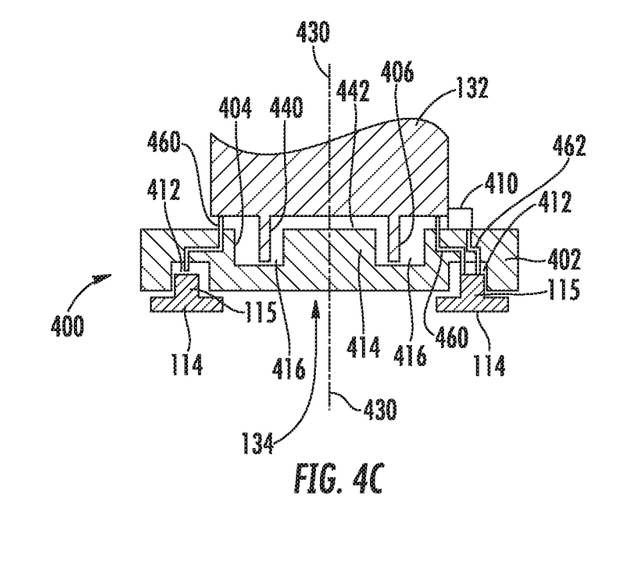
FIG. 4C is a side cross-sectional view of the cooling fan and slide carrier of FIG. 4A, wherein the cooling fan is in the first orientation.
Figure 4D:
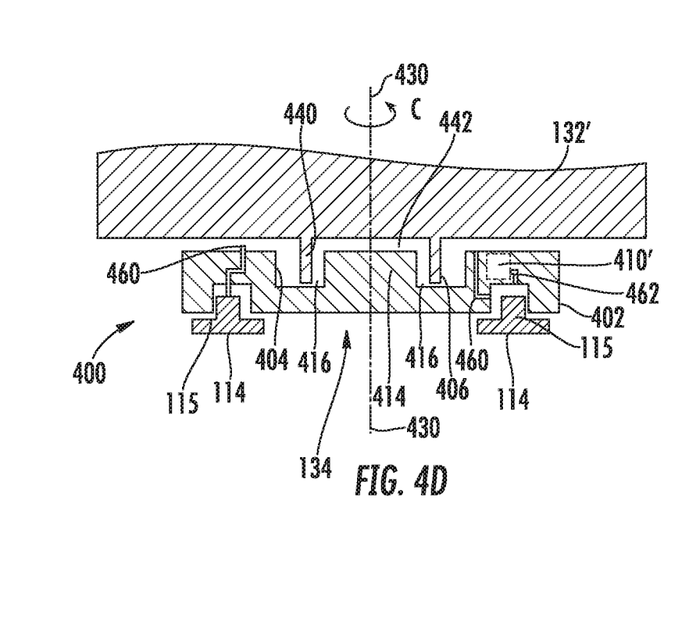
FIG. 4D is a side cross-sectional view of the cooling fan and slide carrier of FIG. 4A, wherein the cooling fan is in the second orientation.

FIGS. 4A-4D illustrate a slide carrier 400 that mounts to the rails 114 and that rotates a cooling fan 132 between the first orientation (illustrated in FIGS. 4A and 4C) and the second orientation (illustrated in FIGS. 4B and 4D). FIGS. 4A and 4B are top views of the slide carrier 400 with a cooling fan 132 mounted thereon, wherein certain details of the pivot 134 (that would otherwise be hidden from view) are also shown. FIGS. 4A and 4B also show the slide carrier 400 mounted on the rails 114 of the fan chassis 110. As discussed above with reference to FIGS. 1-3, the slide carrier 400 can translate along the rails 114 in the direction of arrows A (or in an opposite direction). In this embodiment, a biasing force is applied to the cooling fan 132 by a coiled spring 408 that urges that cooling fan 132 toward the second orientation. The coiled spring 408 applies a torque in the direction of arrows C that urges the cooling fan 132 toward the second orientation. One end of the coiled spring 408 is attached to a fixed location 404 of the base 402 and an opposite end of the coiled spring 408 is attached to the pivot 134 of the cooling fan 132. The base 402 includes a latch 410, which is configured to maintain the cooling fan 132 in the first orientation against the biasing force. In a latched state, the latch 410 engages the cooling fan 132 to retain the cooling fan 132 in the first orientation. In the unlatched state 410' (shown in FIG. 4B), the latch releases, disengaging and clearing the cooling fan 132 such that the cooling fan 132 can rotate from the first orientation to the second orientation about a pivot axis 430 (shown in FIGS. 4C and 4D) in response to the rotational force applied by the spring 408.

FIGS. 4C and 4D are side cross-sectional views of the slide carrier 400 and a bottom portion of the cooling fan 132. FIGS. 4C and 4D illustrate that the latch 410 may extend out of the base 402 in the latched state and may retract into the base 402 in the unlatched state 410'. In one embodiment, the latch 410 may comprise a shape memory alloy that expands or contracts based on the application of an electrical current. In another embodiment, the latch 410 may comprise a solenoid that moves the latch 410 between the latched state and the unlatched state. As discussed above, in one embodiment, the latch 410 receives power from the power socket 106 and power/data cable 136 associated with the cooling fan 132. In another embodiment, the latch 410 receives power and a trigger from the power/data socket 108 and power/data cables 138. For example, in at least one embodiment, as described above, one or both of the rails 114 are configured to receive a DC voltage from the power/data socket 108. Additionally, the power/data socket 108 modulates the DC voltage to transmit data. For example, the power/data socket 108 could modulate the DC voltage between a low voltage and a high voltage, wherein a high voltage for a first period of time indicates a "zero" in binary data and a high voltage for a second period of time indicates a "one" in binary data. In such an embodiment, the latch 410 of each cooling fan 132 includes a semiconductor chip, decoder, or other data processing circuit with a unique binary address, and the circuit is configured to read data in the modulated voltage. To trigger the latch 410 for a particular cooling fan 132, the electrical components 104 (e.g., the BIOS executing on the electrical components 104) outputs the unique binary address for that particular cooling fan 132 to the rails 114 via the power/data socket 108. In response, the circuit triggers the latch 410 to move from the latched state to the unlatched state.

FIGS. 4C and 4D also illustrate details of the pivot 134, according to at least one embodiment. In this embodiment, the pivot 134 comprises a cylindrical wall 440 extending from the bottom of the cooling fan 132. The cylindrical wall 440 forms a cylindrical cavity 442 therein. The base 402 of the slide carrier 400 includes a cavity 416 with a cylindrical post 414 extending from the cavity. The cylindrical cavity 442 of the cooling fan 132 fits over the cylindrical post 414 such that the cooling fan 132 and the cylindrical wall 440 can rotate about the rotational axis 430 relative to the base 402.

The coiled spring 408 is omitted from FIGS. 4C and 4D for clarity. However one end of the coiled spring 408 would be attached to an inward-facing surface 404 in the cavity 416 of the base 402 and the opposing end of the coiled spring 408 would be attached to an outward-facing surface of the cylindrical wall 440 of the cooling fan 132.

In at least one embodiment in which the rails 114 of the fan chassis 110 are electrified or electrifiable, the cooling fans 132 could receive electrical power from the rails 140 such that the power cables 136, illustrated in FIGS. 1-3, may be omitted. As shown in FIG. 4C, when the cooling fan 132 is in the first orientation, the cooling fan 132 may make electrical contact with one or more electrodes 460 passing through the base 402 of the slide carrier 400. The electrodes 460 make contact with the rails 114 and are arranged on the base 402 such that they electrically connect to contacts on the cooling fan 132 when the cooling fan 132 is in the first orientation. As a result, the cooling fan 132 may be powered for operation (i.e., to direct air into the enclosure 102) when the cooling fan 132 is in the first orientation. When the cooling fan 132 rotates to the second orientation, the contacts on the cooling fan 132 may not be aligned with the electrodes 460 arranged on the base 402, such that the cooling fan 132 stops operation.

Figure 5A:
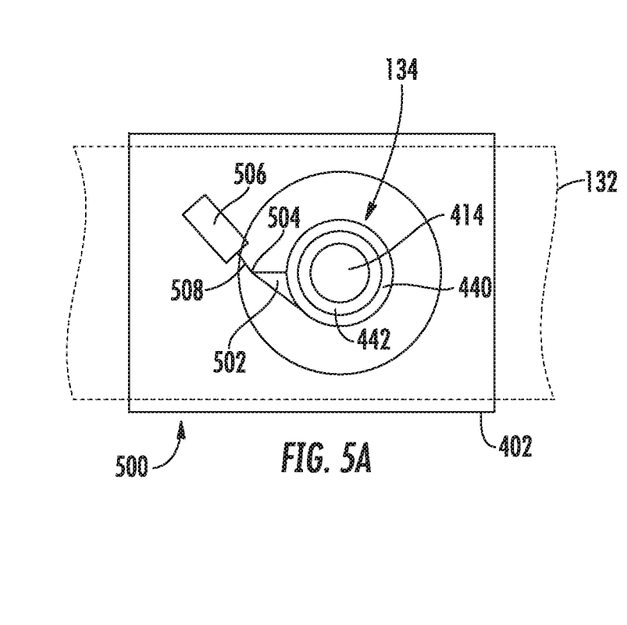
FIG. 5A is a top view of the cooling fan pivotably coupled to a slide carrier with an actuator, according to another embodiment, wherein the cooling fan is in the first orientation.
Figure 5B:
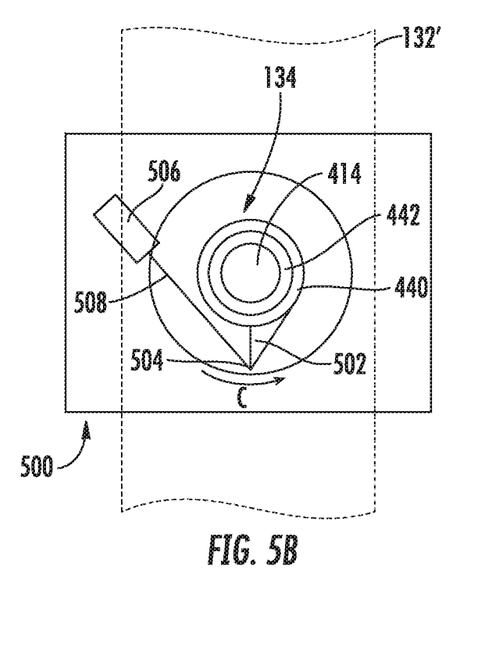
FIG. 5B is a top view of the cooling fan of FIG. 5A, wherein the cooling fan is in the second orientation.

FIGS. 5A and 5B are top views of another slide carrier 500 according to another embodiment. In FIGS. 5A and 5B, the cooling fan 132 is illustrated in broken line to illustrate the mechanism that rotates the cooling fan 132 between the first orientation (shown in FIG. 5A) and the second orientation (shown in FIG. 5B). In this embodiment, the outward-facing surface of the cylindrical wall 440 of the cooling fan 132 includes a cam 502 extending radially outward. A radially-outermost end 504 of the cam 502 is connected to a pushrod 508. The pushrod 508 is also connected to a solenoid 506 or other electrical actuator, such as a shape memory alloy, that moves the pushrod 508 in response to receiving an electrical current (e.g., from the electrified rails 114). FIG. 5A illustrates the pushrod 508 in a retracted state and FIG. 5B illustrates the pushrod 508 in an extended state. As the pushrod 508 moves to the extended state illustrated in FIG. 5B, the pushrod 508 urges the cam 502, which in turn urges the cylindrical wall 440 to rotate in the direction of arrow C.

Figure 6:
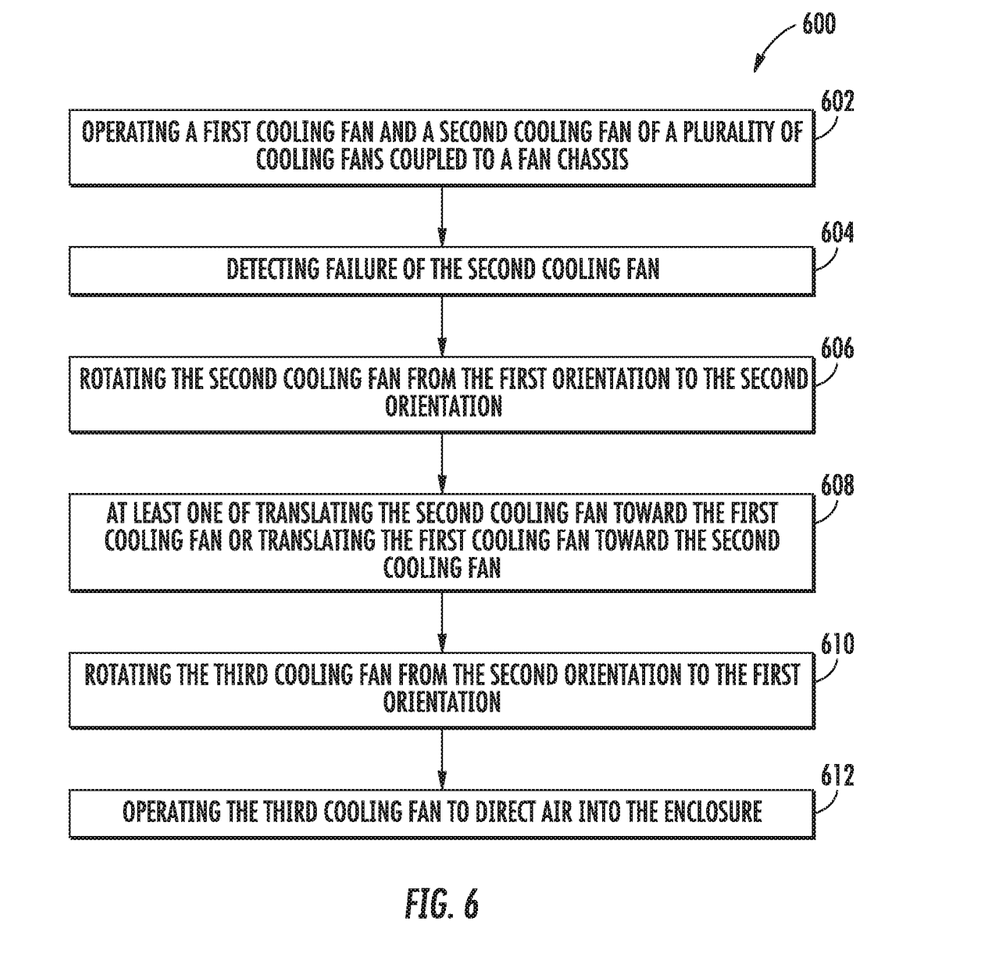
FIG. 6 is a flow chart of a method, according to at least one embodiment.

FIG. 6 is a flowchart for a method 600 for operating a plurality of cooling fans. In block 602 of the method 600, at least a first cooling fan and a second cooling fan of the plurality of cooling fans are operated. In block 604, a failure of the second cooling fan is detected. For example, the power cables 136 providing power from the electrical components 104 to the plurality of cooling fans 132 may receive rotation speed data from the respective ones of the plurality of cooling fans 132. In the event the rotation speed for a particular one of the plurality of cooling fans 132 decreases to zero or decreases below a threshold value, the electrical components 104 would determine that the particular cooling fan 132 has failed. As another example, if the amount of power being used by a power socket 106 for a particular cooling fan 132 exceeds another threshold value, then the electrical components 104 would determine that the particular cooling fan 132 has failed. In at least one embodiment, the electrical components 104 may output an alert upon detecting a failure of a cooling fan 132. For example, in embodiments in which the electrical components 104 include the hardware for a computer, then the electrical components 104 could output a message to a display screen associated with that computer. As another example, the electrical components 104 could output a signal that triggers a light, siren, or other audio and/or visual warning.

In block 606 of the method 600, the second cooling fan is rotated from the first orientation to the second orientation. As discussed above, the cooling fans 132 may be coupled to respective electrically-actuated actuators, such as a solenoid or shape memory alloy, that urges a cooling fan 132 to rotate between the first orientation and the second orientation or that operates a latch maintaining the cooling fan 132 in the first orientation. The electrical components 104 could send a trigger signal to the electrically-actuated actuator (e.g., via the socket 108 and electrodes 138) that causes the electrically-actuated actuator to actuate such that the cooling fan 132 rotates from the first orientation to the second orientation.

In block 608 of the method 600, the second cooling fan translates toward the first cooling fan and/or the first cooling fan translates toward the second cooling fan. As discussed above, which cooling fan or cooling fans translate depends on which fan in a row of fans fails. In the exemplary scenario depicted in FIGS. 1-3, the second cooling fan 132b is the one that fails such that the first cooling fan 132 does not translate. Rather, the second cooling fan 132b, the third cooling fan 132c, and the fourth cooling fan 132d translate toward the first cooling fan 132a. In a different scenario in which the first cooling fan 132a is the one that fails, then the first cooling fan 132a rotates to the second orientation and also translates in the direction of arrow A toward the edge of the fan chassis 110. The remaining cooling fans 132b, 132c, and 132d also translate in the direction of arrows A. As discussed above, a biasing force may be applied to the plurality of cooling fans 132 such that the plurality of cooling fans 132 translate as soon as one of the cooling fans rotates from the first orientation to the second orientation to create room for such translation.

In block 610 of the method 600, a third cooling fan is rotated from the second orientation to the first orientation. Referring again to FIGS. 1-3, the fourth cooling fan 132d is rotated from the second orientation, in FIGS. 1 and 2, to the first orientation, in FIG. 3. As discussed above, the electrical components 104 may transmit a signal to the fourth cooling fan 132d and/or to the slide carrier 400 for the fourth cooling fan 132d. Such an electrical signal may actuate the electrically-actuated actuator to cause the fourth cooling fan 132d to rotate from the second orientation to the first orientation.

In block 612 of the method 600, the third cooling fan is operated to direct air into the enclosure. In FIG. 3, after the fourth cooling fan 132d is rotated to the first orientation, the electrical components 104 provide power to the power socket 106d, which is transmitted to the fourth cooling fan 132d via the power cable 136. Once powered, the fourth cooling fan 132d directs air flow 140 into the enclosure 102.

In at least one embodiment, in response to detecting a failure of a cooling fan, the electrical components 104 in the enclosure 102 (or another computer managing the electrical components 104) may automatically request maintenance for the fan chassis 110 at a future time. That future time may be a scheduled downtime for the system 100. For example, if the system 100 is one computer of a server farm or other networked computing environment that is executing computer-readable program code when a cooling fan fails, the system 100 can immediately and automatically swap out the failed fan with a replacement fan, as described above. At the same time, the electrical components 104 (or other computer) may automatically schedule maintenance for the fan chassis 110 at a future date and/or time when the system 100 is not scheduled to be executing computer-readable program code. Scheduling maintenance for the fan chassis 110 may include transmitting an electronic message to a technician and/or ordering a replacement fan 132 for the fan chassis 110.

In the above-described embodiments, the system is provided with a single reserve cooling fan (i.e., the fourth cooling fan 132d). In various other embodiments, a system 100 could include multiple reserve cooling fans. For example, in the system 100 illustrated in the figures, an additional reserve cooling fan could be provided outboard of the first cooling fan 132a (i.e., to the left of the first cooling fan 132a as depicted in FIG. 1).

In the above-described embodiments, an arrangement of cooling fans is provided that accommodates a failed cooling fan without increasing noise or power usage of an electrical device. By automatically removing a failed fan (by rotating the failed fan out of the way) and inserting a new fan (by rotating the new fan into line with the remaining fans), the new fan can quickly take over for the failed fan, avoiding unnecessary downtime. Additionally, since the electrical device is operating with the same number of fans before and after the failure, the electrical fans can continue to operate at a nominal power setting. Stated differently, the cooling fans do not have to be operated at a higher speed, which increases power consumption and noise due to a failed fan.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Aspects of the present invention may take the form of an entirely hardware embodiment or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources. Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., a computer cooling fan health monitoring application) or related data available in the cloud. For example, the computer cooling fan health monitoring application could execute on a computing system in the cloud and monitor cooling fans for a failure of a cooling fan. In a case where the application detects a failure of a cooling fan, the computer cooling fan health monitoring application could output instructions to cause the failed cooling fan to rotate to the second orientation and cause another cooling fan to rotate to the first orientation and to start directing cooling air into the computer. The computer cooling fan health monitoring application could also store an indication of the failure at a storage location in the cloud. The stored indication could be transmitted to a maintenance organization to schedule a time to replace the failed cooling fan.

While the foregoing is directed to embodiments of the present invention, other and further embodiments of the invention may be devised without departing from the basic scope thereof, and the scope thereof is determined by the claims that follow.

What is claimed is:

1. A system, comprising:
   an enclosure configured to support electrical components disposed therein;
   a fan chassis; and
   a plurality of cooling fans coupled to the fan chassis, wherein each cooling fan of the plurality of cooling fans is rotatable relative to the fan chassis between a first orientation in which the cooling fan is operable to direct air into the enclosure and a second orientation, wherein spacing between centers of a first cooling fan of the plurality of cooling fans and a second cooling fan of the plurality of cooling fans is less when the second cooling fan is in the second orientation than when the second cooling fan is in the first orientation, wherein a third cooling fan of the plurality of cooling fans rotates from the second orientation to the first orientation upon the second cooling fan moving to the second orientation, and wherein the third cooling fan is configured to begin operating to direct the air into the enclosure upon rotating from the second orientation to the first orientation.

2. The system of claim 1, wherein upon the second cooling fan rotating to the second orientation, at least one of:
   the second cooling fan translates along the fan chassis toward the first cooling fan; or
   the first cooling fan translates along the fan chassis toward the second cooling fan.

3. The system of claim 1, wherein the fan chassis comprises a rail, and further comprising a plurality of slide carriers slidably mounted to the rail, wherein a first slide carrier of the plurality of slide carriers is coupled to the first cooling fan, wherein a second slide carrier of the plurality of slide carriers is coupled to the second cooling fan, wherein a third slide carrier of the plurality of slide carriers is coupled to the third cooling fan, and wherein the first slide carrier comprises:
   a pivot; and
   an actuator operable to urge the first cooling fan between the first orientation and the second orientation about the pivot.

4. The system of claim 3, wherein the actuator comprises a shape-memory alloy operable to urge the first cooling fan to rotate from the first orientation to the second orientation about the pivot.

5. The system of claim 3, wherein the actuator comprises:
   a spring configured to urge the first cooling fan rotate from the first orientation to the second orientation about the pivot; and
   a latch configured to retain the first cooling fan in the first orientation while in a latched state and to allow the first cooling fan to rotate from the first orientation to the second orientation about the pivot while in an unlatched state.

6. The system of claim 5, wherein the latch is operable to change between the latched state and the unlatched state in response to a signal from the electrical components.

7. The system of claim 3, wherein, upon the second cooling fan moving from the first orientation to the second orientation, at least one of:
   the first slide carrier coupled to the first cooling fan translates along the rail toward the second cooling fan; or
   the second slide carrier coupled to the second cooling fan translates along the rail toward the first cooling fan.

8. The system of claim 3, wherein the rail comprises an electrical power bus, and wherein the first cooling fan is electrically connected to the rail when respective the first cooling fan is in the first orientation.

9. The system of claim 1, wherein the second cooling fan includes a visual identifier along an edge that is visible outside of the enclosure when the second cooling fan rotates from the first orientation to the second orientation.

10. A method, comprising:
    operating a first cooling fan and a second cooling fan of a plurality of cooling fans coupled to a fan chassis, wherein each cooling fan of the plurality of cooling fans is rotatable relative to the fan chassis between a first orientation in which the cooling fan is operable to direct air into an enclosure supporting electrical components and a second orientation, wherein spacing between centers of a first cooling fan of the cooling fans and a second cooling fan of the cooling fans is less when the second cooling fan is in the second orientation than when the second cooling fan is in the first orientation;
    upon detecting a failure of the second cooling fan:
       rotating the second cooling fan from the first orientation to the second orientation;
       at least one of translating the second cooling fan toward the first cooling fan or translating the first cooling fan toward the second cooling fan;
       rotating a third cooling fan of the plurality of cooling fans from the second orientation to the first orientation; and
       operating the third cooling fan to direct air into the enclosure.

11. The method of claim 10, wherein detecting the failure of the second cooling fan comprises detecting a fan speed of the second cooling fan below a threshold fan speed.

12. The method of claim 11, wherein the electrical components detect the fan speed of the second cooling fan and output an alert upon a detected fan speed of the second cooling fan dropping below the threshold fan speed.

13. The method of claim 10, wherein rotating the second cooling fan with the detected failure about an axis comprises transmitting an electrical signal that causes an actuator to rotate the second cooling fan with the detected failure to the second orientation.

14. The method of claim 13, wherein the electrical components transmit the electrical signal.

15. The method of claim 13, wherein the transmitted electrical signal releases a latch, wherein the latch prevents the second cooling fan from rotating while in a latched state, and wherein the latch enables rotation of the second cooling fan from the first orientation to the second orientation while in a released state.

16. The method of claim 13, wherein the electrical signal energizes a shape-memory alloy, wherein a shape of the shape-memory alloy while energized urges the second cooling fan to rotate from the first orientation to the second orientation.

17. A computer program product for implementing fan cooling of an electronics enclosure, the computer program product comprising a computer-readable medium program having program instructions therewith, the program instructions executable by a processor to perform an operation comprising:

operating a first cooling fan and a second cooling fan of a plurality of cooling fans coupled to a fan chassis, wherein each cooling fan of the plurality of cooling fans is rotatable relative to the fan chassis between a first orientation in which the cooling fan is operable to direct air into an enclosure supporting electrical components and a second orientation, and wherein spacing between centers of the first cooling fan and the second cooling fan is less when the second cooling fan is in the second orientation than when the second cooling fan is in the first orientation;

upon detecting a failure of the second cooling fan:

rotating the second cooling fan from the first orientation to the second orientation;

at least one of translating the second cooling fan toward the first cooling fan or translating the first cooling fan toward the second cooling fan;

rotating a third cooling fan of the plurality of cooling fans from the second orientation to the first orientation; and     operating the third cooling fan to direct air into the enclosure.

18. The computer program product of claim 17, wherein detecting the failure of the second cooling fan comprises detecting a fan speed of the second cooling fan below a threshold fan speed.

19. The computer program product of claim 18, wherein rotating the second cooling fan from the first orientation to the second orientation comprises transmitting an electrical signal that causes an actuator to urge the second cooling fan with the detected failure to the second orientation.

\* \* \* \* \*